(12) United States Patent
Inoue et al.

(10) Patent No.: US 12,004,315 B2
(45) Date of Patent: Jun. 4, 2024

(54) COVERING LID AND DEVICE

(71) Applicant: FUJIFILM Business Innovation Corp., Tokyo (JP)

(72) Inventors: Hayato Inoue, Kanagawa (JP); Shogo Fujita, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 351 days.

(21) Appl. No.: 17/403,845

(22) Filed: Aug. 16, 2021

(65) Prior Publication Data

US 2022/0312608 A1    Sep. 29, 2022

(30) Foreign Application Priority Data

Mar. 24, 2021 (JP) ................................. 2021-050330

(51) Int. Cl.
*H05K 5/03* (2006.01)
(52) U.S. Cl.
CPC ....................................... *H05K 5/03* (2013.01)
(58) Field of Classification Search
CPC .......... H05K 5/0008; H05K 5/00; H05K 5/02; H05K 5/03; B65D 45/24; B65D 45/00–10
See application file for complete search history.

(56) References Cited

U.S. PATENT DOCUMENTS

| | | | | |
|---|---|---|---|---|
| 9,879,435 B2* | 1/2018 | Kruger | ..................... | E04F 19/08 |
| 2013/0213708 A1* | 8/2013 | Chitaka | ................... | H05K 5/061 |
| | | | | 174/559 |
| 2013/0215562 A1* | 8/2013 | Kobayashi | ........... | H05K 5/0008 |
| | | | | 361/679.01 |
| 2013/0240183 A1* | 9/2013 | Sun | ........................... | G01F 1/20 |
| | | | | 165/121 |
| 2013/0258609 A1* | 10/2013 | Ke | ........................... | H05K 5/02 |
| | | | | 361/747 |
| 2013/0299208 A1* | 11/2013 | Moldovan | .............. | H02G 3/086 |
| | | | | 174/50 |

(Continued)

FOREIGN PATENT DOCUMENTS

JP          2019134121          8/2019

*Primary Examiner* — Kareen K Thomas
(74) *Attorney, Agent, or Firm* — JCIPRNET

(57) ABSTRACT

A covering lid includes a first plate portion provided with plural insertion portions into which a screw portion of a fastener having the screw portion and a head portion having a diameter larger than the screw portion is inserted and having a first surface facing an inside of a device and a second surface facing an outside of the device, the first plate portion being fixed by the plural fasteners of which the screw portion is inserted into each of the plural insertion portions so as to cover an opening of a device housing extending upward, downward, and rightward, and leftward; and a second plate portion extending apart from the first plate portion to a second surface side of the first plate portion so as to face at least some insertion portions on the same upper, lower, left, or right side of the opening among the plural insertion portions, being removed from the device housing, and being provided with a hook portion hooked to the fastener attached to the device housing in a state where the first surface faces the outside of the device and in a state where the head portion is apart from a surface of the device housing.

20 Claims, 3 Drawing Sheets

(56) References Cited

U.S. PATENT DOCUMENTS

| | | | |
|---|---|---|---|
| 2013/0314852 A1* | 11/2013 | Kincaid | F16M 11/04 |
| | | | 361/679.01 |
| 2013/0319754 A1* | 12/2013 | Makino | H01R 13/46 |
| | | | 174/549 |
| 2013/0322009 A1* | 12/2013 | Lin | G11B 33/08 |
| | | | 361/679.34 |
| 2019/0283694 A1* | 9/2019 | Chaen | H02G 3/086 |
| 2019/0286047 A1* | 9/2019 | Ishimitsu | G03G 21/1647 |
| 2019/0289731 A1* | 9/2019 | Mei | E05C 3/02 |
| 2020/0387191 A1* | 12/2020 | Tsau | F16B 5/02 |

* cited by examiner

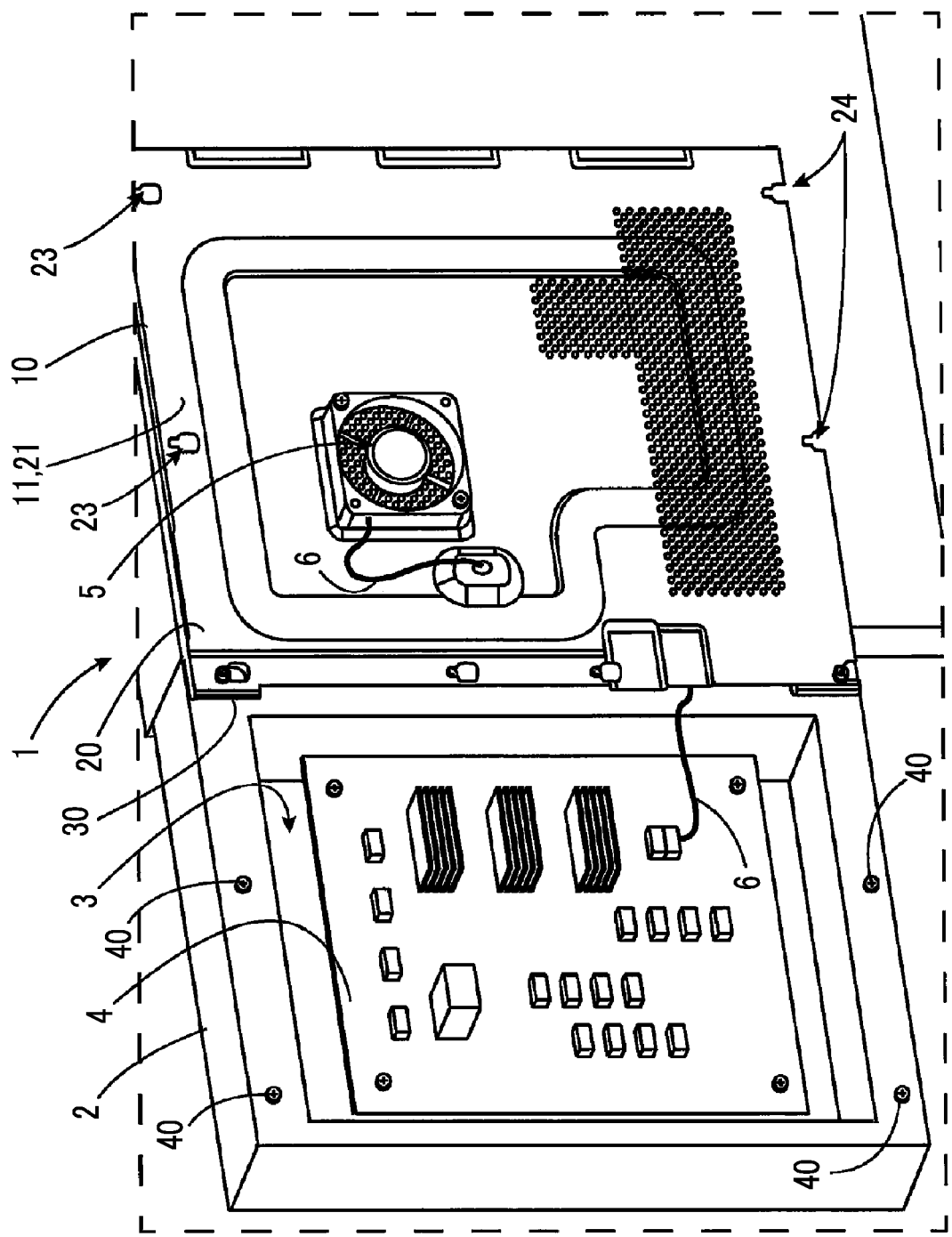

COVERING LID AND DEVICE

CROSS-REFERENCE TO RELATED APPLICATIONS

This application is based on and claims priority under 35 USC 119 from Japanese Patent Application No. 2021-050330 filed Mar. 24, 2021.

BACKGROUND

(i) Technical Field

The present invention relates to a covering lid and a device.

(ii) Related Art

There are devices having a structure in which a device housing has an opening, components and the like requiring maintenance are arranged inside the opening, and a covering lid is attached so as to cover the opening. The covering lid is removed in a case where maintenance is performed on the components inside the opening.

JP2019-134121A proposes a structure in which a so-called bell-shaped hole is provided in the covering lid in order to improve maintenance workability, and the covering lid once removed is hooked to a fixing bolt used for fixing the covering lid.

SUMMARY

Aspects of non-limiting embodiments of the present disclosure relate to a covering lid that covers an opening and a device provided with the covering lid, which are also applicable to devices having a device housing having a structure protruding from a peripheral edge of the opening at a position adjacent to the opening.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a covering lid including a first plate portion provided with a plurality of insertion portions into which a screw portion of a fastener having the screw portion and a head portion having a diameter larger than the screw portion is inserted and having a first surface facing an inside of a device and a second surface facing an outside of the device, the first plate portion being fixed by a plurality of the fasteners of which the screw portion is inserted into each of the plurality of insertion portions so as to cover an opening of a device housing extending upward, downward, and rightward, and leftward, and a second plate portion extending apart from the first plate portion to a second surface side of the first plate portion so as to face at least some insertion portions on the same upper, lower, left, or right side of the opening among the plurality of insertion portions, being removed from the device housing, and being provided with a hook portion hooked to the fastener attached to the device housing in a state where the first surface faces the outside of the device and in a state where the head portion is apart from a surface of the device housing.

BRIEF DESCRIPTION OF THE DRAWINGS

Exemplary embodiment(s) of the present invention will be described in detail based on the following figures, wherein:

FIG. 2 is a perspective view showing a state where a covering lid is removed and the covering lid is hooked next to an opening.

DETAILED DESCRIPTION

Hereinafter, exemplary embodiments of the present invention will be described.

Figure 1:
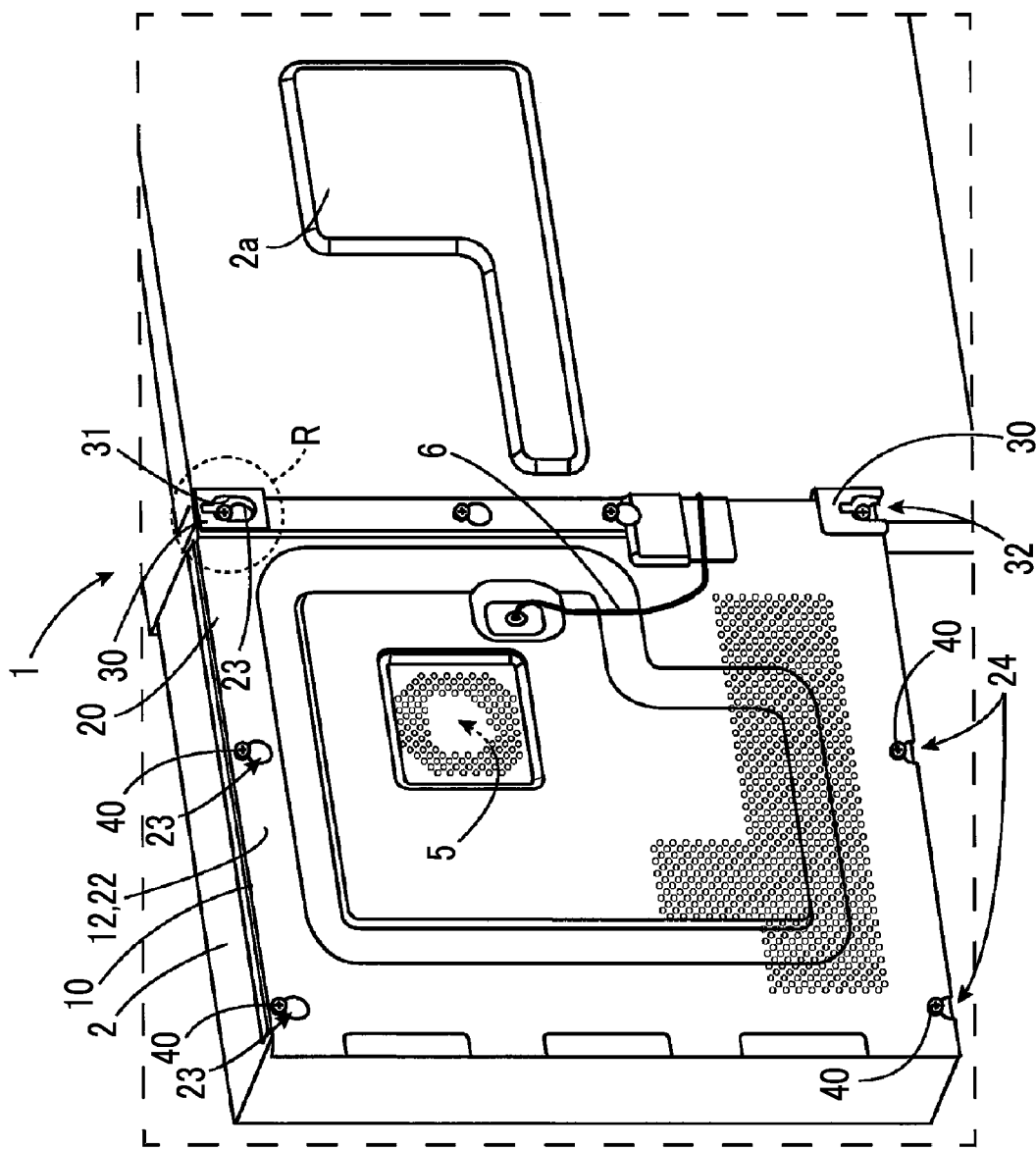
FIG. 1 is a perspective view showing a part of the appearance of the device.

FIG. 1 is a perspective view showing a part of the appearance of a device.

Additionally, FIG. 2 is a perspective view showing a state where a covering lid is removed and the covering lid is hooked next to an opening.

An opening 3 is formed in a housing 2 of a device 1. Also, a circuit board 4 is arranged at a position in the housing 2 facing the opening 3. As shown in FIG. 1, the opening 3 is covered with a covering lid 10 screwed by screws 40.

However, the circuit board 4 needs to be maintained as necessary. In the maintenance, the covering lid 10 is removed, and as shown in FIG. 2, is arranged next to the opening 3 of the housing 2 in a state where the covering lid 10 is hooked to the screw 40 that has been screwed.

Here, in the covering lid 10 in the state of covering the opening 3, a surface that faces the inside of the device 1 and a surface that faces the outside of the device 1 are referred to as a first surface 11 and a second surface 12, respectively. In a state where the opening 3 is covered with the covering lid 10 shown in FIG. 1, the second surface 12 of the covering lid 10 faces the outside. On the other hand, as shown in FIG. 2, the first surface 11 of the covering lid 10 faces the outside in a state where the covering lid 10 is removed and arranged next to the opening 3.

Additionally, the device 1 includes a fan 5. The fan 5 is fixed to the first surface 11 of the covering lid 10 and is connected to the circuit board 4 by a wiring line 6. In the maintenance of the circuit board 4, the fan 5 needs to be connected to the circuit board 4.

Additionally, a protruding portion 2a protruding from an edge portion of the opening 3 is formed in the housing 2 at a position next to the opening 3, that is, at a position of the housing 2 covered with the covering lid 10 arranged next to the opening 3.

The covering lid 10 has a first plate portion 20 and a second plate portion 30. The first plate portion 20 has an area sufficient to cover the entire surface of the opening 3 of the housing 2. The first surface 11 and the second surface 12 of the covering lid 10 are also a first surface 21 and a second surface 22 of the first plate portion 20. The first plate portion 20 is screwed to the housing 2 at a total of eight locations, three locations along an upper edge, three locations along a lower edge, and two further locations along a right edge. For screwing, insertion holes 23 into which the screws 40 are inserted are formed in the first plate portion 20 at five locations excluding three locations along the lower edge. Additionally, screw-inserting notches 24 into which the screws 40 are inserted are formed at three locations along the lower edge. Both the insertion holes 23 and the screw-inserting notches 24 correspond to an example of an insertion portion referred to in the present invention.

Additionally, in the present exemplary embodiment, the second plate portions 30 are provided at the positions of two upper and lower locations of right corners of the first plate portion 20, which face the insertion holes 23 or screw-inserting notches 24 formed at the corresponding positions of the first plate portion 20. The second plate portions 30 provided at the two locations extends apart from the first plate portion 20 to the second surface 22 side of the first plate portion 20. The second plate portions 30 are used in a case where the covering lid 10 is removed from the housing 2 and hooked in a posture shown in FIG. 2.

Figure 3A:
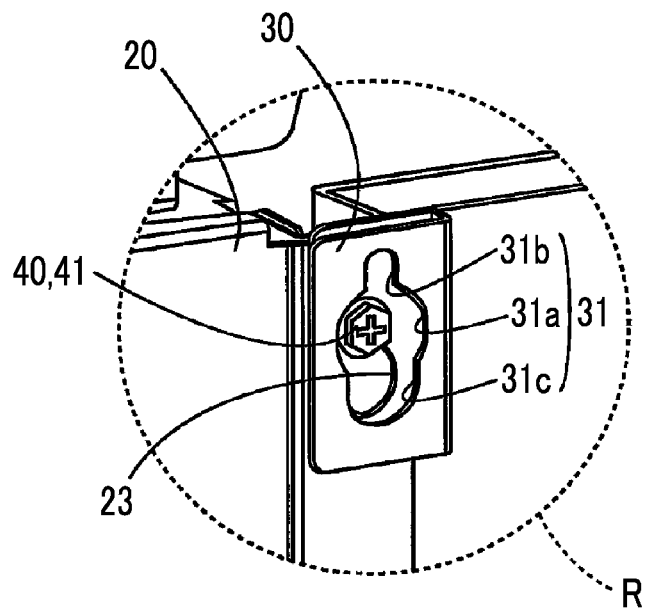
FIGS. 3A and 3B are enlarged views of a portion indicated by a circle R in FIG. 1.
Figure 3B:
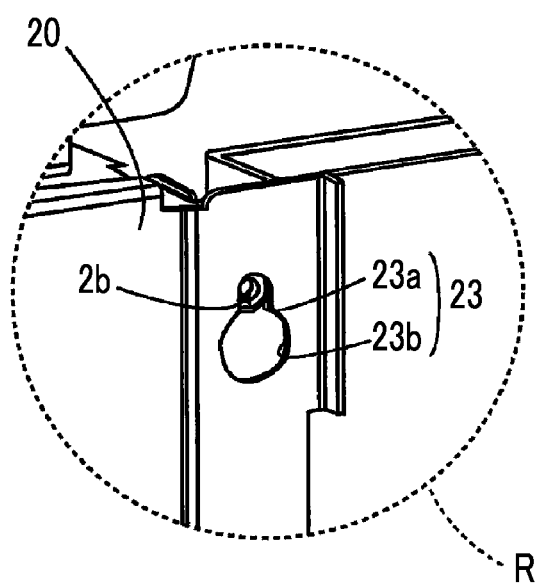

FIGS. 3A and 3B are enlarged views of a portion indicated by a circle R in FIG. 1. Here, FIG. 3A is a diagram showing the structure, including a second plate portion, of the portion indicated by the circle R, and FIG. 3B is a diagram in which the second plate portion 30 of the same portion is removed and an insertion hole 23 of the first plate portion 20 is shown. A head portion 41 of a screw 40 that screws the covering lid 10 to the housing 2 is shown in FIG. 3A, but the screw 40 is removed and a screw hole 2b formed in the housing 2 is shown in FIG. 3B.

Here, first, the shape of the insertion hole 23 formed in the first plate portion 20 will be described with reference to FIG. 3B.

The insertion holes 23 has a first hole portion 23a and a second hole portion 23b connected to a lower portion of the first hole portion 23a. The first hole portion 23a is a hole having a diameter for inserting a screw portion (not shown) of the screw 40 screwed into the screw hole 2b formed in the housing 2, and is a hole that blocks a hole having a diameter that the passage of the head portion 41 of the screw 40 is blocked. Accordingly, the covering lid 10 is fixed to the housing 2 with the screw. On the other hand, the second hole portion 23b has a wide diameter such that the head portion 41 of the screw 40 can also pass therethrough. Accordingly, in removing the covering lid 10 fixed to the housing 2, the covering lid 10 is lifted until the height positions of the screw 40 and the second hole portion 23b coincide with the screw 40 in a state where the screw 40 is loosened without being completely removed from the housing 2. Then, the covering lid 10 can be removed by pulling the covering lid 10 toward the near side. The first hole portion 23a and the second hole portion 23b of the insertion hole 23 correspond to an example of a first opening portion and a second opening portion, respectively, as referred to in the present invention.

The screw-inserting notches 24 are formed at three locations along the lower edge of the covering lid 10, instead of the insertion holes 23. Each screw-inserting notch 24 is a notch having a shape in which the insertion hole 23 shown in FIG. 3B is connected to a lower edge of the first plate portion 20 and a lower half of the second hole portion 23b is missing. Regarding the screw-inserting notch 24, a portion corresponding to the first hole portion 23a of the insertion holes 23 corresponds to an example of the first opening portion referred to in the present invention. Additionally, the portion of the screw-inserting notch 24 having a shape in which the lower half of the second hole portion 23b is missing corresponds to an example of the second opening portion referred to in the present invention.

Next, the second plate portion 30 will be described with reference to FIG. 3A.

The second plate portion 30 of the present exemplary embodiment has a shape in which an extension portion is formed on the first plate portion 20 and the extension portion is folded back toward the second surface 22 side of the first plate portion 20. A gap that is equal to or larger than the thickness dimension of the head portion 41 of the screw 40 is provided between the first plate portion 20 and the second plate portion 30 so that the head portion 41 of the screw 40 can be arranged in the gap. Additionally, the total dimension of the gap and the thickness of the second plate portion 30 is a dimension equal to or larger than the protruding amount of the protruding portion 7 shown in FIG. 1. The reason thereof will be described below.

A hook hole 31 is formed in the second plate portion 30. The hook hole 31 is formed by a third hole portion 31a, a fourth hole portion 31b, and a fifth hole portion 31c.

The third hole portion 31a is a portion that is provided at a position overlapping the first hole portion 23a of the insertion hole 23 in an insertion direction of the screw 40 and having such a diameter that the head portion 41 of the screw 40 is allowed to pass therethrough.

By providing the third hole portion 31a that allows the head portion 41 of the screw 40 to pass therethrough, access to the head portion 41 of the screw 40 is facilitated in a case where the covering lid 10 is screwed to the housing 2.

Additionally, the fourth hole portion 31b is a portion connected to an upper side of the third hole portion 31a and has such a hole diameter that the screw portion of the screw 40 is allowed to pass through and the passage of the head portion 41 of the screws 40 is blocked.

As described above, after the screw 40 is loosened and removed once, the covering lid 10 is turned inside out such that the first surface 11 and the second surface have interchanged orientations and is hooked to the screw 40 attached to the housing 2 in a state where the head portion 41 of the screw 40 is apart from the housing 2. In a case where the covering lid 10 is turned inside out and hooked to the screw 40, the covering lid 10 is lifted to a position where the third hole portion 31a is at the same height as the screw 40, and the head portion 41 of the screw 40 is inserted into the third hole portion 31a, and the hand lifting the covering lid 10 is loosened. Then, the screw 40 is at the same height position as the fourth hole portion 31b, and the covering lid 10 is in a state of being hooked in the hook hole 31. In a case where the covering lid 10 in the state of being hooked in the hook hole 31 is removed, the covering lid 10 is lifted until the third hole portion 31a is at the same height as the screw 40, and is pulled in an orientation in which the covering lid is pulled away from the housing 2. By doing so, the covering lid 10 can be removed.

Here, as described above, the total dimension of the gap between the first plate portion 20 and the second plate portion 30 and the thickness of the second plate portion 30 is a dimension equal to or larger than the protruding amount of the protruding portion 2a shown in FIG. 1. This is provided in order to allow the hook hole 31 to be hooked to the screw 40 by turning the covering lid 10 inside out even in a case where the housing 2 has the protruding portion 2a.

Additionally, in the case of the present exemplary embodiment, the covering lid 10 can be moved between a state where the opening 3 shown in FIG. 1 is closed and a hooked state shown in FIG. 2 with the fan 5 connected to the circuit board 4 without removing the wiring line 6 of the fan 5.

Moreover, the hook hole 31 has the fifth hole portion 31c connected to a lower side the third hole portion 31a. The fifth hole portion 31c is provided so as to visually recognize that the head portion 41 of the screw 40 in a case where the covering lid 10 attached so as to close the opening 3 of the housing 2 is lifted for removal or in a case where the covering lid 10 is attached so as to close the opening 3 of the housing 2 again. By providing the fifth hole portion 31c, the covering lid 10 can be easily removed and attached.

Here, the hook hole 31 corresponds to an example of a hook portion referred to in the present invention. Additionally, the third hole portion 31a, the fourth hole portion 31b, and the fifth hole portion 31c of the hook hole 31 correspond to examples of a third opening portion, a fourth opening portion, and a fifth opening portion, respectively, as referred to in the present invention.

A hooking notch 32 is formed at a lower second plate portion 30 shown in FIG. 1, instead of the hook hole 31. The hooking notch 32 is notched in a shape in which the third hole portion 31a of the hook hole 31 formed in the upper second plate portion 30 shown in FIG. 3A reaches a lower edge of the second plate portion 30 and the fourth hole portion 31b is missing. The hooking notch 32 also corresponds to an example of a hook portion according to the exemplary embodiment of the invention. Additionally, the portions of the hooking notch 32 corresponding to the third hole portion 31a and the fourth hole portion 31b of the hook hole 31 correspond to examples of the third opening portion and the fourth opening portion, respectively, as referred to in the present invention. However, a portion corresponding to the fifth opening portion referred to in the present invention is not present in the hooking notch 32.

Here, the insertion hole 23 provided in the first plate portion does not extend to the same height position as the fourth hole portion 31b of the hook hole 31. In a case where the covering lid 10 is attached so as to close the opening 3 with the first surface 11 facing outward, that is, with the orientation shown in FIG. 2, a part of the head portion 41 of the screw is covered with the first plate portion 20, and it becomes difficult to access the screw. This prevents the covering lid 10 from being attached in this erroneous posture.

In this way, according to the covering lid 10 of the present exemplary embodiment, since the second plate portion 30 having a gap between the first plate portion 20 and the second plate portion 30 is provided, even in a case where there is the protruding portion 2a, the covering lid 10 may be hooked in the state shown in FIG. 2 while avoiding the protruding portion 2a.

In addition, in the present exemplary embodiment, the second plate portions 30 are provided on the right side of the first plate portion 20 in a posture shown in FIG. 1. However, depending on the structure of the housing 2 of the device 1, a structure may be adopted in which the second plate portions 30 are provided at a lower portion of the first plate portion 20 and hooked so as to be suspended below the opening 3. In this way, the second plate portions 30 may be provided on the same upper, lower, left, or right side of the opening 3.

Additionally, in the present exemplary embodiment, the covering lid 10 is screwed to the housing 2 but the screws are not necessarily used. For example, bolts or the like may be used, and fasteners for fixing the covering lid 10 to the housing 2 may be fasteners each having a screw portion and a head portion having a diameter larger than the diameter of the screw portion. Additionally, all the fasteners are not necessarily the same fasteners.

Moreover, although the present exemplary embodiment has been described by exemplifying the circuit board 4 and the device 1 having the opening 3 for the maintenance of the circuit board 4, a maintenance target is not required to be the circuit board and is also not required to be the opening 3 for maintenance, and may be widely applied to devices that have an opening normally closed with a covering lid and that are required to remove the covering lid to open the opening.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A covering lid comprising:
a first plate portion provided with a plurality of insertion portions and having a first surface facing an inside of a device and a second surface facing an outside of the device, wherein each of the plurality of insertion portions is configured to be inserted with a screw portion of a fastener having the screw portion and a head portion with a diameter larger than that of the screw portion so that the first plate portion is fixed by the fasteners and covers an opening of a device housing extending upward, downward, and rightward, and leftward; and
a second plate portion extending apart from the first plate portion to a second surface side of the first plate portion so as to face at least some insertion portions on a same upper, lower, left, or right side of the opening among the plurality of insertion portions, being removed from the device housing, and being provided with a hook portion hooked to the fastener attached to the device housing in a state where the first surface faces the outside of the device and in a state where the head portion is apart from a surface of the device housing.

2. The covering lid according to claim 1,
wherein each of the plurality of insertion portions includes a first opening portion in which the screw portion is inserted into the insertion portion and that blocks passage of the head portion, and a second opening portion that is connected to a lower portion of the first opening portion and allows the head portion to pass therethrough.

3. The covering lid according to claim 1,
wherein a gap equal to or larger than a thickness dimension of the head portion is provided between the first plate portion and the second plate portion.

4. The covering lid according to claim 2,
wherein a gap equal to or larger than a thickness dimension of the head portion is provided between the first plate portion and the second plate portion.

5. The covering lid according to claim 2,
wherein the hook portion includes a third opening portion that is provided at a position overlapping the first opening portion in an insertion direction of the screw portion and allows the head portion to pass therethrough, and a fourth opening portion that is connected to an upper side of the third opening portion, allows the screw portion to pass therethrough, and blocks the passage of the head portion.

6. The covering lid according to claim 3,
wherein the hook portion includes a third opening portion that is provided at a position overlapping the first opening portion in an insertion direction of the screw portion and allows the head portion to pass therethrough, and a fourth opening portion that is connected to an upper side of the third opening portion, allows the screw portion to pass therethrough, and blocks the passage of the head portion.

7. The covering lid according to claim 4,
wherein the hook portion includes a third opening portion that is provided at a position overlapping the first opening portion in an insertion direction of the screw portion and allows the head portion to pass therethrough, and a fourth opening portion that is connected to an upper side of the third opening portion, allows the screw portion to pass therethrough, and blocks the passage of the head portion.

8. The covering lid according to claim 3,
wherein a part of the head portion of the fastener hooked to the hook portion is covered with the first plate portion in a state where the hook portion is hooked to the fastener with the first surface facing the outside of the device.

9. The covering lid according to claim 4,
wherein a part of the head portion of the fastener hooked to the hook portion is covered with the first plate portion in a state where the hook portion is hooked to the fastener with the first surface facing the outside of the device.

10. The covering lid according to claim 5,
wherein the hook portion includes a fifth opening portion that is a hook hole provided in the second plate portion, the hook hole being connected to a lower side of the third opening portion, and allowing the head portion to be visually recognized in a case where the covering lid is lifted to a position overlapping the head portion in a state where the screw portion is inserted into the insertion hole.

11. The covering lid according to claim 6,
wherein the hook portion includes a fifth opening portion that is a hook hole provided in the second plate portion, the hook hole being connected to a lower side of the third opening portion, and allowing the head portion to be visually recognized in a case where the covering lid is lifted to a position overlapping the head portion in a state where the screw portion is inserted into the insertion hole.

12. The covering lid according to claim 7,
wherein the hook portion includes a fifth opening portion that is a hook hole provided in the second plate portion, the hook hole being connected to a lower side of the third opening portion, and allowing the head portion to be visually recognized in a case where the covering lid is lifted to a position overlapping the head portion in a state where the screw portion is inserted into the insertion hole.

13. The covering lid according to claim 1,
wherein the second plate portion has a shape in which an extension portion of the first plate portion is folded back.

14. The covering lid according to claim 2,
wherein the second plate portion has a shape in which an extension portion of the first plate portion is folded back.

15. The covering lid according to claim 3,
wherein the second plate portion has a shape in which an extension portion of the first plate portion is folded back.

16. The covering lid according to claim 4,
wherein the second plate portion has a shape in which an extension portion of the first plate portion is folded back.

17. The covering lid according to claim 5,
wherein the second plate portion has a shape in which an extension portion of the first plate portion is folded back.

18. The covering lid according to claim 6,
wherein the second plate portion has a shape in which an extension portion of the first plate portion is folded back.

19. A device comprising:
the covering lid according to claim 1; and
a device housing having an opening that is covered with the covering lid by screwing.

20. The apparatus device according to claim 19,
wherein a protruding portion that protrudes from an edge portion of the opening of the device housing is provided at a position of the device housing covered with the first plate portion in a state where the hook portion is hooked to the fastener, and
in the covering lid, a total dimension of a gap between the first plate portion and the second plate portion and a thickness of the second plate portion is equal to or larger than a protruding amount of the protruding portion.

* * * * *